United States Patent
Kai et al.

(10) Patent No.: US 9,318,363 B2
(45) Date of Patent: Apr. 19, 2016

(54) SUBSTRATE PROCESSING SYSTEM AND SUBSTRATE POSITION CORRECTION METHOD

(71) Applicant: TOKYO ELECTRON LIMITED, Tokyo (JP)

(72) Inventors: Kozo Kai, Fuchu (JP); Takamasa Chikuma, Nirasaki (JP); Keiji Osada, Nirasaki (JP); Chunmui Li, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/370,973

(22) PCT Filed: Jan. 8, 2013

(86) PCT No.: PCT/JP2013/050056
§ 371 (c)(1),
(2) Date: Jul. 8, 2014

(87) PCT Pub. No.: WO2013/105533
PCT Pub. Date: Jul. 18, 2013

(65) Prior Publication Data
US 2015/0005928 A1 Jan. 1, 2015

(30) Foreign Application Priority Data
Jan. 10, 2012 (JP) .................... 2012-002038

(51) Int. Cl.
*H01L 21/67* (2006.01)
*H01L 21/677* (2006.01)
(52) U.S. Cl.
CPC .... *H01L 21/67265* (2013.01); *H01L 21/67772* (2013.01)

(58) Field of Classification Search
CPC .................... H01L 21/67772; H01L 21/67265
See application file for complete search history.

(56) References Cited

U.S. PATENT DOCUMENTS

| 6,413,356 | B1 * | 7/2002 | Chokshi | H01L 21/67772 156/345.32 |
| 6,470,927 | B2 * | 10/2002 | Otaguro | H01L 21/67772 141/65 |
| 6,641,350 | B2 * | 11/2003 | Nakashima | H01L 21/67772 414/217 |

(Continued)

FOREIGN PATENT DOCUMENTS

| JP | 11-204612 A | 7/1999 |
| JP | 2002-164411 A | 6/2002 |

(Continued)

*Primary Examiner* — Thomas Randazzo
(74) *Attorney, Agent, or Firm* — Nath, Goldberg & Meyer; Jerald L. Meyer

(57) ABSTRACT

In STEP 1, a mapping operation is carried out by a mapping device. In STEP 2, based on position information for the wafer (W) detected by the mapping operation, it is determined whether or not a wafer (W) position is in an abnormal state or not. When the wafer position is determined to be in the abnormal state (Yes), a closing/opening operation, in which a FOUP door (19c) is temporarily closed and then opened, is carried out in STEP 3. In STEP 4, the number of times the FOUP door (19c) is closed/opened (in other words, the number of times a port door (62) is closed/opened) is counted, and in STEP 5, it is determined whether or not this count value is less than a preset value. If the count value is less than the preset value (Yes), the processing in STEP 1-STEP 5 is repeated once again.

6 Claims, 10 Drawing Sheets

(56) References Cited

U.S. PATENT DOCUMENTS

| | | | | |
|---|---|---|---|---|
| 6,824,344 B2* | 11/2004 | Otaguro | ............ | H01L 21/67265 414/217.1 |
| 7,677,859 B2* | 3/2010 | Gilchrist | ........... | H01L 21/67772 414/217 |
| 8,128,333 B2* | 3/2012 | Aburatani | ......... | H01L 21/67766 414/217 |
| 8,814,488 B2* | 8/2014 | Aburatani | ......... | H01L 21/67769 414/217 |
| 8,821,099 B2* | 9/2014 | Hall | .................. | H01L 21/67775 118/500 |
| 8,888,433 B2* | 11/2014 | Gilchrist | ........... | H01L 21/67353 414/217.1 |
| 2011/0158774 A1* | 6/2011 | Yamaguchi | ....... | H01L 21/67265 414/222.02 |

FOREIGN PATENT DOCUMENTS

| | | | | |
|---|---|---|---|---|
| JP | 2008-311419 A | | 12/2008 | |
| JP | 2010-123672 | * | 6/2010 | .............. H02L 21/68 |
| JP | 2010-123672 A | | 6/2010 | |

* cited by examiner

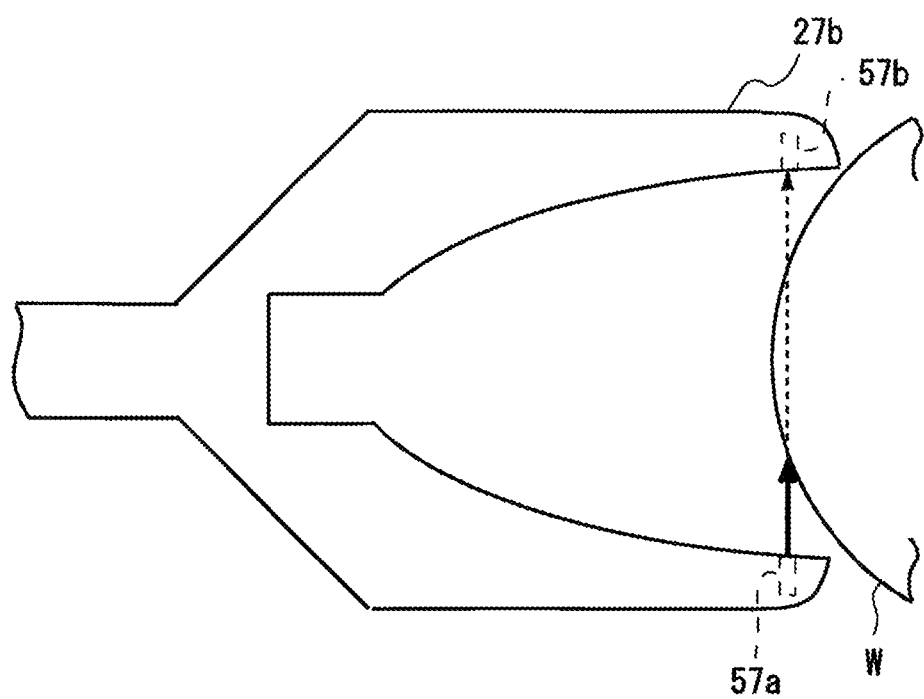

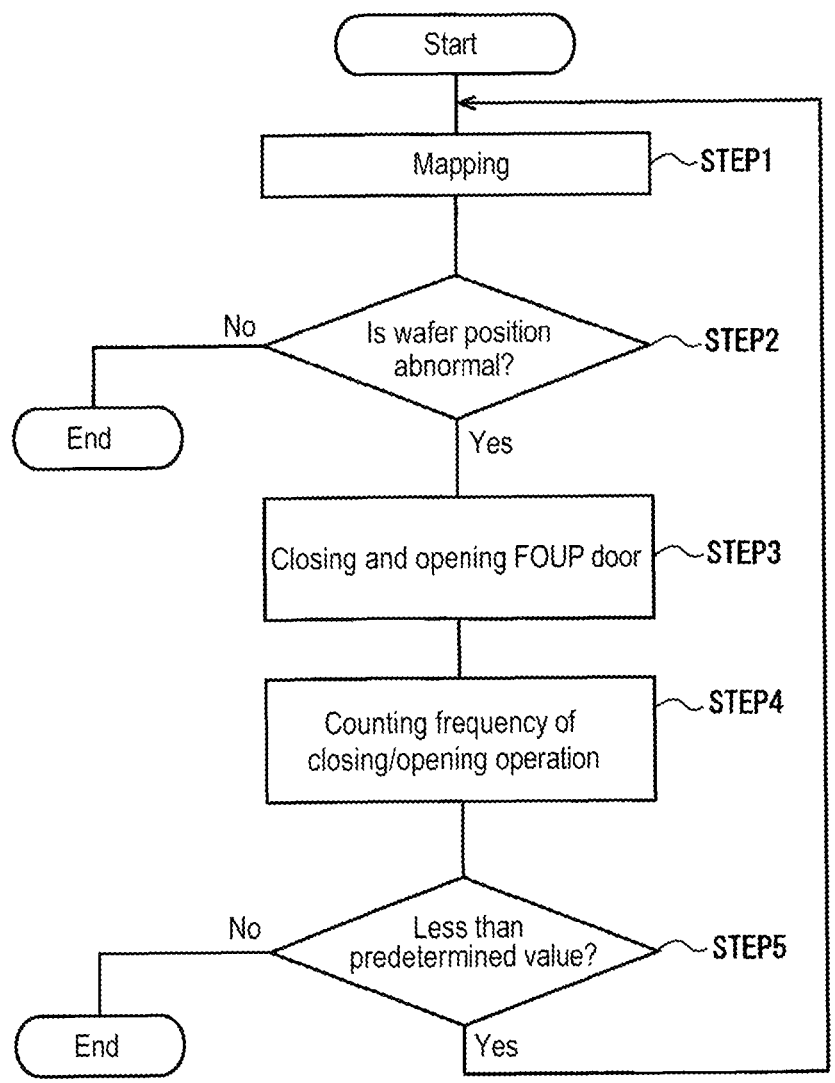

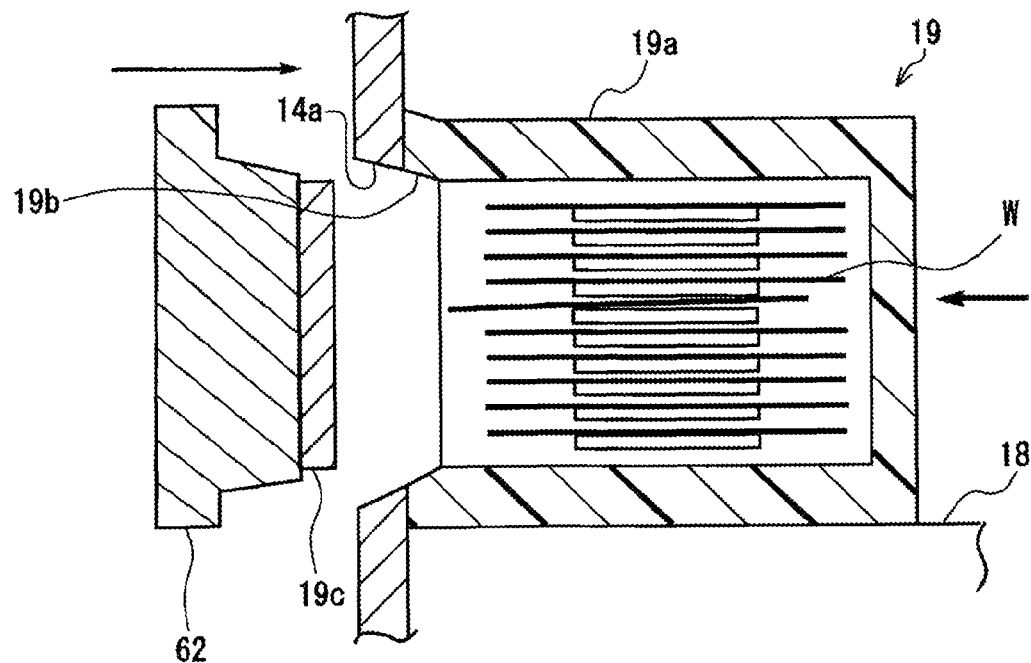

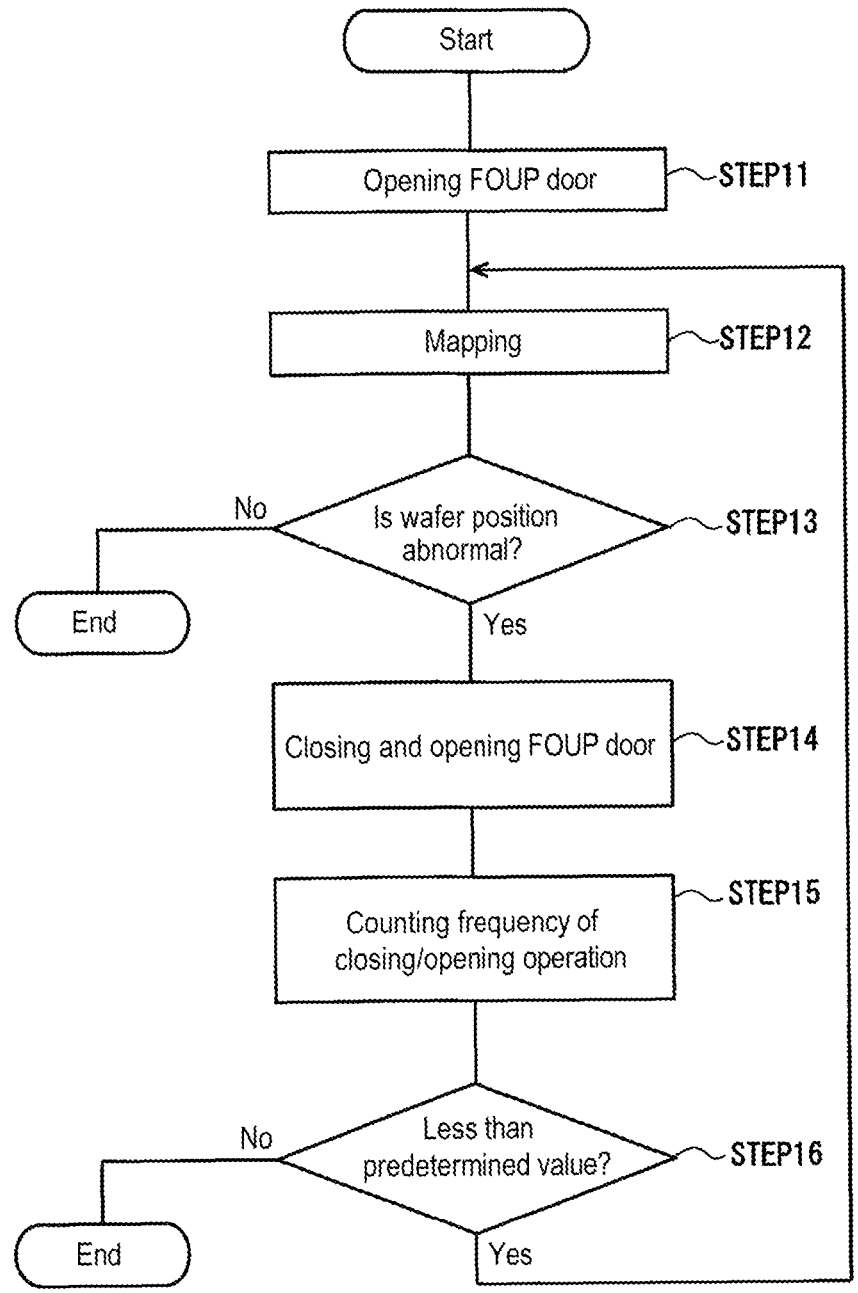

SUBSTRATE PROCESSING SYSTEM AND SUBSTRATE POSITION CORRECTION METHOD

This is a National Phase Application filed under 35 U.S.C. 371 as a national stage of PCT/JP2013/050056, filed Jan. 8, 2013, and claims priority benefit from Japanese Application No. 2012-002038, filed Jan. 10, 2012, the content of each of which is hereby incorporated by reference in its entirety.

TECHNICAL FIELD

The present disclosure relates to a substrate processing system and a substrate position correction method that corrects the position of a substrate accommodated within a transport container in the substrate processing system.

BACKGROUND

In a semiconductor device manufacturing process, a cassette or a transport container (carrier) called a FOUP (Front Opening Unified Pod), which accommodates a plurality of semiconductor wafers in multiple stages, is used. The carrier includes a body and an opening/closing door detachably attached to an opening portion of the body. Grooves for supporting semiconductor wafers are formed on the inner wall surface of the body of the carrier at a specified interval. The semiconductor wafers can be inserted into the grooves.

In order to determine the existence or absence and the position of semiconductor wafers accommodated within the carrier in multiple stages, a mapping process is performed in a state in which the carrier is mounted to a load port of a substrate processing system. Typically, an optical sensor including a light source and a light receiving unit is used in the mapping. To improve a sensor mechanism for the mapping process, for example, Patent Document 1 (Japanese Patent Laid-open Publication No. 2002-164411) proposes a FOUP opener in which a sensor advancing/retreating mechanism and a sensor attachment member are installed in a port door lift mechanism for opening and closing an opening/closing door of a FOUP.

If it is detected by the mapping process that a semiconductor wafer is deviated in position and accommodated in an abnormal state such as a tilted state, a conventional substrate processing system issues a warning and stops a process in a loader module that performs the carry-in and carry-out of semiconductor wafers using a FOUP. An operator manually conducts a correction work. The correction work is manually performed and is, therefore, time-consuming Thus, the correction work becomes a major culprit in prolonging the apparatus stop time and consequently reducing the productivity of the substrate processing system as a whole.

In order to correct the position of a semiconductor wafer within a carrier, for example, Patent Document 2 (Japanese Patent Laid-open Publication No. 2008-311419) proposes a technology in which a movable member protruding and retracting with respect to a mounting surface of a table is installed in a load port device provided with the table for mounting a carrier thereon and in which the position of a semiconductor wafer within the carrier is corrected by the vibration of the movable member. For the similar purpose, Patent Document 3 (Japanese Patent Laid-open Publication No. H11-204612) proposes the installation of a wafer position correction means which corrects the position of a semiconductor wafer by pressing the end surface of the semiconductor wafer accommodated within a cassette in a protruding state or the installation of a tilt drive means which tilts a cassette stage.

The proposals of Patent Documents 2 and 3 suffer from a problem of reduced usefulness because dedicated complex mechanisms should be additionally installed in a loader module in order to correct the position of a semiconductor wafer within a carrier.

SUMMARY

The present disclosure provides a substrate processing system and a substrate position correction method which are capable of easily correcting a position deviation of a substrate accommodated within a carrier and shortening an apparatus down time.

A substrate processing system according to a first aspect of the present disclosure loads and unloads substrates through the use of a transport container accommodating and supporting the substrates in multiple stages. The transport container includes an opening portion for inserting the substrates therethrough and an opening/closing door for closing the opening portion.

The substrate processing system according to the first aspect of the present disclosure includes: a mounting unit on which the transport container is mounted; an opening/closing device configured to perform an opening/closing operation by holding the opening/closing door of the transport container mounted on the mounting unit; a mapping device configured to perform a mapping operation while the opening/closing door is kept open, and configured to detect and acquire a position of each of the substrates accommodated within the transport container as substrate position information; and a first control unit configured to control the opening/closing device and the mapping device.

In the substrate processing system according to the first aspect of the present disclosure, the first control unit determines, based on the substrate position information detected by the mapping device, whether the substrate position is in a normal state or in an abnormal state, and if the substrate position is in the abnormal state, controls the opening/closing device to perform a closing/opening operation by which the opening/closing door is closed and then opened, and thereafter, controls the mapping device to perform a next mapping operation.

In the substrate processing system according to the first aspect of the present disclosure, the first control unit may perform a control to repeat the closing/opening operation and the next mapping operation.

In the substrate processing system according to the first aspect of the present disclosure, if the substrate position detected by the next mapping operation is in the normal state, the first control unit may perform a control to stop the closing/opening operation and the next mapping operation, and may transmit the substrate position information of the normal state obtained in the last mapping operation a second control unit which is a higher level control unit than the first control unit.

In the substrate processing system according to the first aspect of the present disclosure, if the frequency of repetition of the closing/opening operation and the next mapping operation reaches a predetermined frequency, the repetition of the closing/opening operation and the next mapping operation may be stopped and the substrate position information obtained in the last mapping operation may be transmitted to a second control unit which is a higher level control unit than the first control unit.

A substrate position correction method of the present disclosure corrects a position of each of substrates in a substrate processing system that loads and unloads the substrates through the use of a transport container accommodating and supporting the substrates in multiple stages, the transport container including an opening portion for inserting the substrates therethrough and an opening/closing door for closing the opening portion, the system including: a mounting unit on which the transport container is mounted; an opening/closing device configured to perform an opening/closing operation by holding the opening/closing door of the transport container mounted on the mounting unit; a mapping device configured to perform a mapping operation while the opening/closing door is kept open, and configured to detect and acquire a position of each of the substrates accommodated within the transport container as substrate position information; and a control unit configured to control the opening/closing device and the mapping device.

The substrate position correction method of the present disclosure includes: a step of performing the mapping operation using the mapping device; if it is detected in the mapping operation that the substrate position is in an abnormal state, a step of performing a closing/opening operation by which the opening/closing door is closed and then opened; and a step of performing a next mapping operation using the mapping device.

In the substrate position correction method of the present disclosure, the step of performing the closing/opening operation and the step of performing the next mapping operation may be repeated.

In the substrate position correction method of the present disclosure, if the substrate position detected by the next mapping operation is in a normal state, the control unit may stop the repetition of the step of performing the closing/opening operation and the step of performing the next mapping operation.

In the substrate position correction method of the present disclosure, if the frequency of the repetition of the step of performing the closing/opening operation and the step of performing the next mapping operation reaches a predetermined frequency, the repetition may be stopped.

A substrate processing system according to a second aspect of the present disclosure loads and unloads substrates through the use of a transport container accommodating and supporting the substrates in multiple stages, the transport container including an opening portion for inserting the substrates therethrough and an opening/closing door for closing the opening portion.

The substrate processing system according to the second aspect of the present disclosure includes: a mounting unit on which the transport container is mounted; an opening/closing device configured to perform an opening/closing operation by holding the opening/closing door of the transport container mounted on the mounting unit; a mapping device configured to perform a mapping operation while the opening/closing door is kept open, and configured to detect and acquire a position of each of the substrates accommodated within the transport container as substrate position information; and a control unit configured to control the opening/closing device and the mapping device, In the substrate processing system according to the second aspect of the present disclosure, the control unit includes: a determination unit configured to determine, based on the substrate position information detected by the mapping device, whether the substrate position is in a normal state or in an abnormal state; an opening/closing control unit configured to, if the determination result of the determination unit indicates the abnormal state, allow the opening/closing device to perform a closing/opening operation by which the opening/closing door is closed and then opened; and a mapping operation control unit configured to allow the mapping device to perform a next mapping operation if the closing/opening operation is performed.

According to the substrate processing system and the substrate position correction method of the present disclosure, the abnormal state of the substrate accommodated within the transport container can be rapidly corrected through the use of the opening/closing door of the transport container without installing any special mechanism and without resort to a manual work. Accordingly, it is possible to make the down time of an apparatus as short as possible and to prevent a reduction in the production efficiency.

BRIEF DESCRIPTION OF THE DRAWINGS

FIG. 2B is a plan view of a fork used in describing a mapping sensor.

FIG. 5 is a flowchart illustrating one example of a control sequence which includes a substrate position correction method according to the first embodiment of the present disclosure.

FIG. 6A is an explanatory view showing a closing/opening operation of a FOUP door before closed.

FIG. 7 is a flowchart illustrating one example of a control sequence which includes a substrate position correction method according to a second embodiment of the present disclosure.

DETAILED DESCRIPTION

Embodiments of the present disclosure will now be described in detail with reference to the accompanying drawings.

[First Embodiment]

Figure 1:
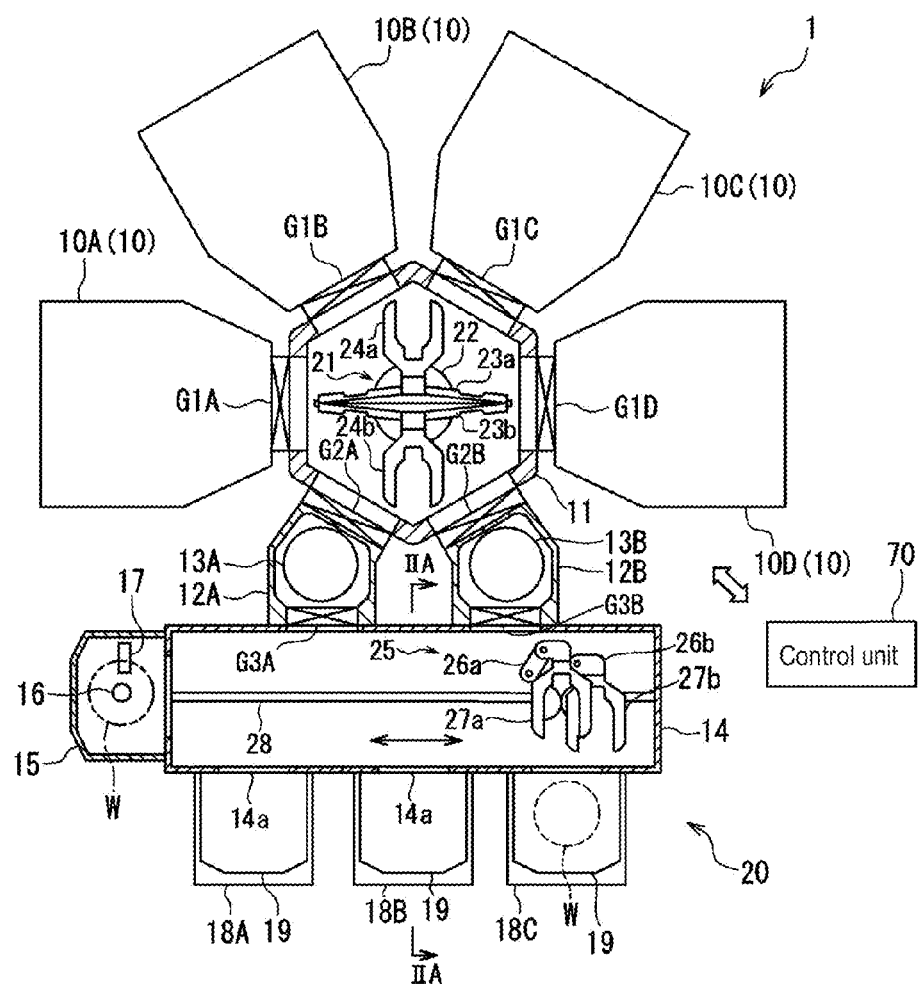
FIG. 1 is a plan view illustrating the schematic configuration of a substrate processing system according to a first embodiment of the present disclosure.

Referring first to FIG. 1, a configuration of a substrate processing system will be described according to a first embodiment of the present disclosure.

<Configuration of Substrate Processing System>

FIG. 1 is a plan view illustrating the schematic configuration of a substrate processing system according to the present embodiment. The substrate processing system 1 according to the present embodiment is an apparatus that performs, through a plurality of continuous operations, specified processes such as a film forming process, a diffusing process, an etching process and the like with respect to, e.g., a semiconductor substrate (hereinafter referred to as a "wafer") W for use in the manufacture of a semiconductor device.

The substrate processing system 1 includes a plurality of process modules in which specified processes are performed with respect to the wafer W. In the present embodiment, the substrate processing system 1 includes four process modules 10A, 10B, 10C and 10D. Each of the process modules 10A, 10B, 10C and 10D is configured such that the internal space thereof can be kept in a specified depressurized environment (in a vacuum state).

The substrate processing system 1 further includes a first transfer chamber 11 and two load lock chambers 12A and 12B. In the present embodiment, the first transfer chamber 11 includes six side surfaces. The process modules 10A, 10B, 10C and 10D and the load lock chambers 12A and 12B are arranged adjacent to the respective side surfaces of the first transfer chamber 11. In FIG. 1, for example, the process modules 10A, 10B, 10C and 10D and the load lock chambers 12A and 12B are arranged in a clockwise order of the process modules 10A, 10B, 10C and 10D, the load lock chamber 12B and the load lock chamber 12A so as to surround the first transfer chamber 11. Similar to the respective processing chambers of the process modules 10A, 10B, 10C and 10D, the first transfer chamber 11 is configured such that it can be kept in a specified depressurized environment.

The load lock chambers 12A and 12B are configured such that the internal spaces thereof can be switched between an atmospheric pressure state and a vacuum state. A substrate mounting stand 13A for mounting the wafer W thereon is arranged within the load lock chamber 12A. A substrate mounting stand 13B for mounting the wafer W thereon is arranged within the load lock chamber 12B.

The substrate processing system 1 further includes gate valves G1A, G1B, G1C, G1D, G2A and G2B. The gate valve G1A is arranged between the first transfer chamber 11 and the processing chamber of the process module 10A. The gate valve G1B is arranged between the first transfer chamber 11 and the processing chamber of the process module 10B. The gate valve G1C is arranged between the first transfer chamber 11 and the processing chamber of the process module 10C. The gate valve G1D is arranged between the first transfer chamber 11 and the processing chamber of the process module 10D. The gate valve G2A is arranged between the first transfer chamber 11 and the load lock chamber 12A. The gate valve G2B is arranged between the first transfer chamber 11 and the load lock chamber 12B.

Each of the gate valves G1A to G1D, G2A and G2B has a function of opening and closing an opening portion formed in a wall which divides two adjoining spaces. In a closed state, the gate valves G1A to G1D hermetically seal the respective processing chambers of the process modules 10A, 10B, 10C and 10D. In an open state, the gate valves G1A to G1D allow the wafer W to be transferred between the respective processing chambers and the first transfer chamber 11. In a closed state, the gate valves G2A and G2B maintain the air-tightness of the first transfer chamber 11. In an open state, the gate valves G2A and G2B allow the wafer W to be transferred between the first transfer chamber 11 and the load lock chambers 12A and 12B.

The substrate processing system 1 further includes a loader module 20 that performs the loading of the wafer W into the substrate processing system 1 and the unloading of the wafer W from the substrate processing system 1. The loader module 20 includes a second transfer chamber 14, an orienter 15 as a device for aligning the position of the wafer W, and a plurality of load ports 18A, 18B and 18C. The second transfer chamber 14 is formed such that the horizontal cross section thereof has a rectangular shape elongated in one direction (in the left-right direction in FIG. 1) and is arranged such that the load lock chambers 12A and 12B are interposed between the first transfer chamber 11 and the second transfer chamber 14. One side surface of the second transfer chamber 14 is adjacent to the load lock chambers 12A and 12B. The second transfer chamber 14 includes a circulation facility that supplies, e.g., a nitrogen gas or a clean air, into the internal space thereof in the form of a down-flow.

The orienter 15 is connected to one longitudinal end portion of the second transfer chamber 14. The orienter 15 includes a rotary plate 16 rotated by a drive motor (not shown) and an optical sensor 17 installed in the outer periphery of the rotary plate 16 and configured to detect the peripheral edge portion of the wafer W.

In FIG. 1, for example, the substrate processing system 1 includes three load ports 18A, 18B and 18C. The load ports 18A, 18B and 18C are arranged adjacent to the openings 14a of the second transfer chamber 14 at the opposite side of the second transfer chamber 14 from the side surface adjoining the load lock chambers 12A and 12B. The respective load ports 18A, 18B and 18C are configured to mount FOUPs 19 as wafer transport containers. Wafers W can be disposed within each of the FOUPs 19 in multiple stages with gaps left in the vertical direction.

The substrate processing system 1 further includes gate valves G3A and G3B. The gate valve G3A is arranged between the load lock chamber 12A and the second transfer chamber 14. The gate valve G3B is arranged between the load lock chamber 12B and the second transfer chamber 14. Each of the gate valves G3A and G3B is configured to open and close an opening portion formed in a wall which divides two adjacent spaces. When in a closed state, the gate valves G3A and G3B maintain the air-tightness of the load lock chambers 12A and 12B. In an open state, the gate valves G3A and G3B allow the wafer W to be transferred between the load lock chambers 12A and 12B and the second transfer chamber 14.

The substrate processing system 1 further includes a first transfer device 21 arranged within the first transfer chamber 11 and a second transfer device 25 arranged within the second transfer chamber 14. The first transfer device 21 is a device configured to transfer the wafer W between the respective processing chambers of the process modules 10A, 10B, 10C and 10D and the load lock chambers 12A and 12B. The second transfer device 25 is a device configured to transfer the wafer W between the respective FOUPs 19 of the load ports 18A, 18B and 18C, the load lock chambers 12A and 12B and the orienter 15.

The first transfer device 21 includes a base portion 22, a pair of transfer arm portions 23a and 23b connected to the base portion 22 and arranged in a mutually-opposing relationship, a fork 24a installed at the distal end of the transfer arm portion 23a, and a fork 24b installed at the distal end of the transfer arm portion 23b. The respective transfer arm portions 23a and 23b are configured such that they can be contracted and extended and can be rotated about the rotation axis of the base portion 22. Each of the forks 24a and 24b serves as a holding member that mounts and holds the wafer W. The first transfer device 21 transfers the wafer W in a state in which the wafer W is mounted on one of the forks 24a and 24b.

The second transfer device 25 is configured such that it can move in the longitudinal direction of the second transfer chamber 14 (in the left-right direction in FIG. 1) along a guide rail 28 arranged within the second transfer chamber 14. The second transfer device 25 includes a pair of transfer arm portions 26a and 26b arranged in two stages in the vertical direction, a fork 27a installed at the distal end of the transfer arm portion 26a, and a fork 27b installed at the distal end of the transfer arm portion 26b. The respective transfer arm portions 26a and 26b are configured such that they can be contracted and extended and can also be rotated. Each of the forks 27a and 27b serves as a holding member that mounts and holds the wafer W. The second transfer device 25 transfers the wafer W in a state in which the wafer W is mounted on one of the forks 27a and 27b.

<Loader Module>

Figure 2A:
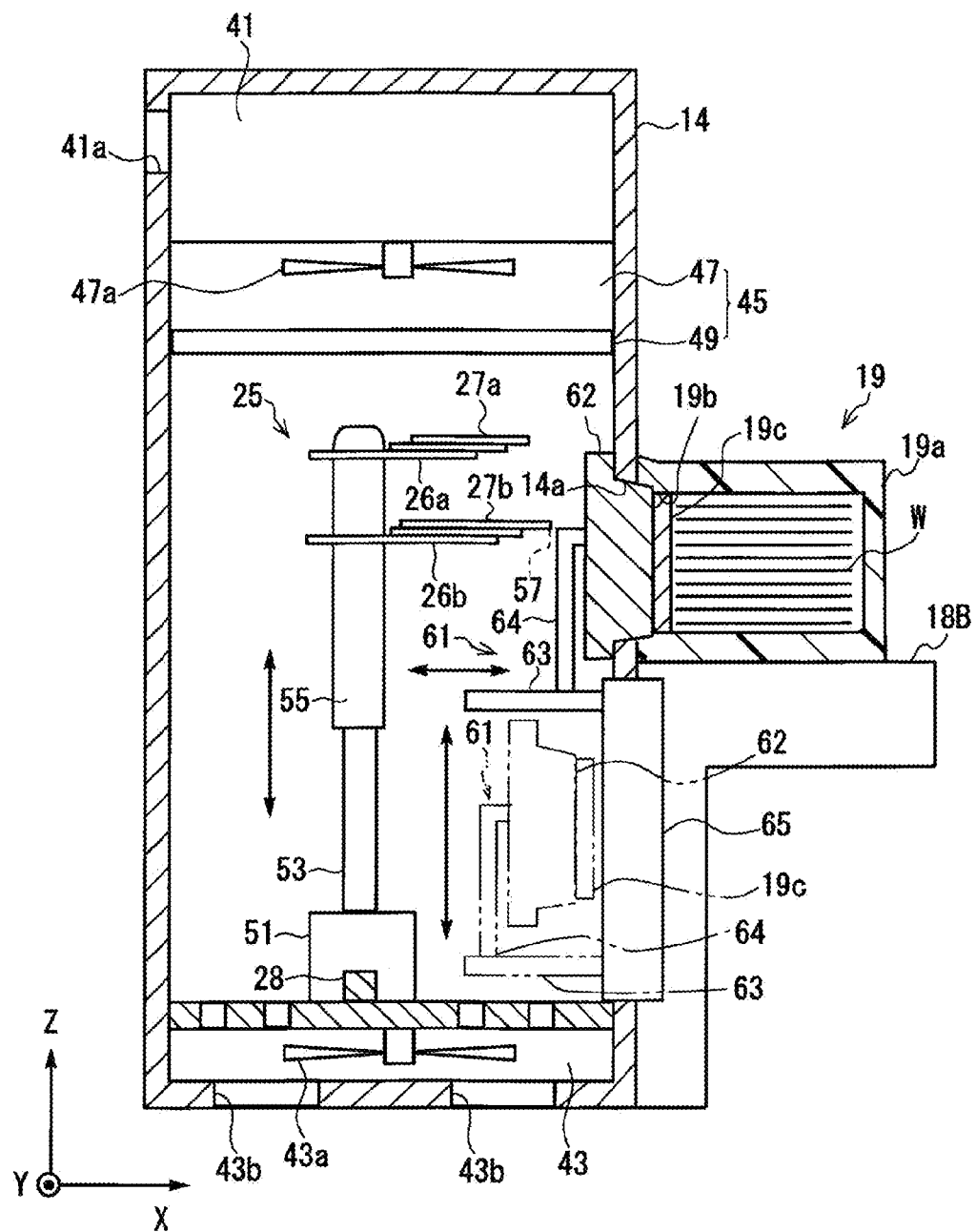
FIG. 2A is a sectional view taken along a line IIA-IIA in FIG. 1.

Next, the configuration of the loader module 20 will be described in detail with reference to FIG. 2A. FIG. 2A is a sectional view taken along a line IIA-IIA in FIG. 1. The second transfer chamber 14 includes an air introduction portion 41 installed at the upper side, an air discharge portion 43 installed at the lower side, and the second transfer device 25 installed between the air introduction portion 41 and the air discharge portion 43. The second transfer chamber 14 further includes an FFU (Fan Filter Unit) 45 installed adjacent to the air introduction portion 41, and three FOUP openers 61 (not shown in FIG. 1) which serve as opening/closing devices for opening and closing FOUP doors 19C of the FOUPs 19 respectively mounted in the three load ports 18A, 18B and 18C.

The air introduction portion 41 introduces external air from an air introduction port 41a. An exhaust fan 43a is installed in the air discharge portion 43. The exhaust fan 43a is configured to exhaust the air existing within the second transfer chamber 14 from an air exhaust port 43b formed on the bottom surface of the air discharge portion 43 to the outside of the second transfer chamber 14. The FFU 45 includes a fan unit 47 and a filter unit 49 arranged in the named order from the upper side. The fan unit 47 includes a fan 47a configured to blow the air toward the lower side. The filter unit 49 collects dusts existing in the air passed through the fan unit 47. The FFU 45 is configured to generate a down-flow of the air, in which the air is introduced into the second transfer chamber 14 through the air introduction portion 41, passes through a substrate transfer portion where the second transfer device 25 is installed, and is discharged from the air discharge portion 43. The FFU 45 is further configured to collect and remove the dusts contained in the air. As such, the interior of the second transfer chamber 14 may be kept clean.

Base end portions of the transfer arm portions 26a and 26b in the second transfer device 25 are connected to a lift unit 55 which moves up and down along a support 53 erected from a base portion 51 of the second transfer device 25. Thus, the transfer arm portions 26a and 26b are configured to move up and down in the Z-axis direction. A mapping sensor 57 configured to emit, e.g., laser light to determine the existence or absence and the position of the wafer W is arranged at the distal end of the fork 27b of the transfer arm portion 26b. FIG. 2B is an enlarged plan view of the fork 27b of the second transfer device 25. The mapping sensor 57 includes a light emitting unit 57a and a light receiving unit 57b. The light emitted from the light emitting unit 57a is received by the light receiving unit 57b. If the wafer W is interposed between the light emitting unit 57a and the light receiving unit 57b, the light is blocked by the wafer W. Thus, the existence of the wafer W is recognized and the positional information of the wafer W is acquired by a module controller 401A to be described later. During a mapping operation, in order to recognize the positions and the number of the wafers W accommodated within each of the FOUPs 19, the transfer arm portion 26b is extended halfway and is scanned (moved up or down) along the stacking direction of the wafers W accommodated within each of the FOUPs 19 in multiple stages.

With this scanning operation, the mapping sensor 57 installed at the distal end of the fork 27b determines the positions and the number of the wafers W accommodated within each of the FOUPs 19. In the present embodiment, the fork 27b provided with the mapping sensor 57, the transfer arm portion 26b and the second transfer device 25 constitute a mapping device that performs a mapping operation.

In this regard, each of the FOUPs 19 mounted in the load ports 18A, 18B and 18C as mounting portions includes a body 19a, an opening portion 19b formed in the body 19a, and the FOUP door 19c as a detachable opening/closing door configured to close the opening portion 19b.

The FOUP opener 61 includes a port door 62 configured to hold the FOUP door 19c, an advancing/retreating mechanism unit 63 configured to horizontally move the port door 62, an arm unit 64 configured to interconnect the port door 62 and the advancing/retreating mechanism unit 63, and a lift mechanism unit 65 configured to vertically move the port door 62 with the FOUP door 19c held in the port door 62. The port door 62 detachably holds the FOUP door 19c using a holding mechanism (not shown). The port door 62 is advanced or retreated in the X-axis direction in FIG. 2A by the advancing/retreating mechanism unit 63. In an advanced position, the port door 62 holds and removes the FOUP door 19c which closes the opening portion 19b of each of the FOUPs 19. The port door 62 is retreated while holding the FOUP door 19c, thereby opening the opening portion 19b of each of the FOUPs 19. Moreover, the port door 62 is advanced while holding the FOUP door 19c, thereby attaching the FOUP door 19c to the opening portion 19b of each of the FOUPs 19. Then, the port door 62 is retreated while leaving the FOUP door 19c, thereby closing the opening portion 19b of each of the FOUPs 19 with the FOUP door 19c.

In a retreated position, the port door 62 is moved up or down in the Z-axis direction in FIG. 2A together with the advancing/retreating mechanism unit 63 in a state in which the FOUP door 19c is held by the lift mechanism unit 65. In a lowered position, the port door 62 stores the FOUP door 19c in a lower area within the second transfer chamber 14. In a raised and advanced position, the port door 62 closes an opening 14a formed in the wall of the second transfer chamber 14.

<Control System>

Figure 3:
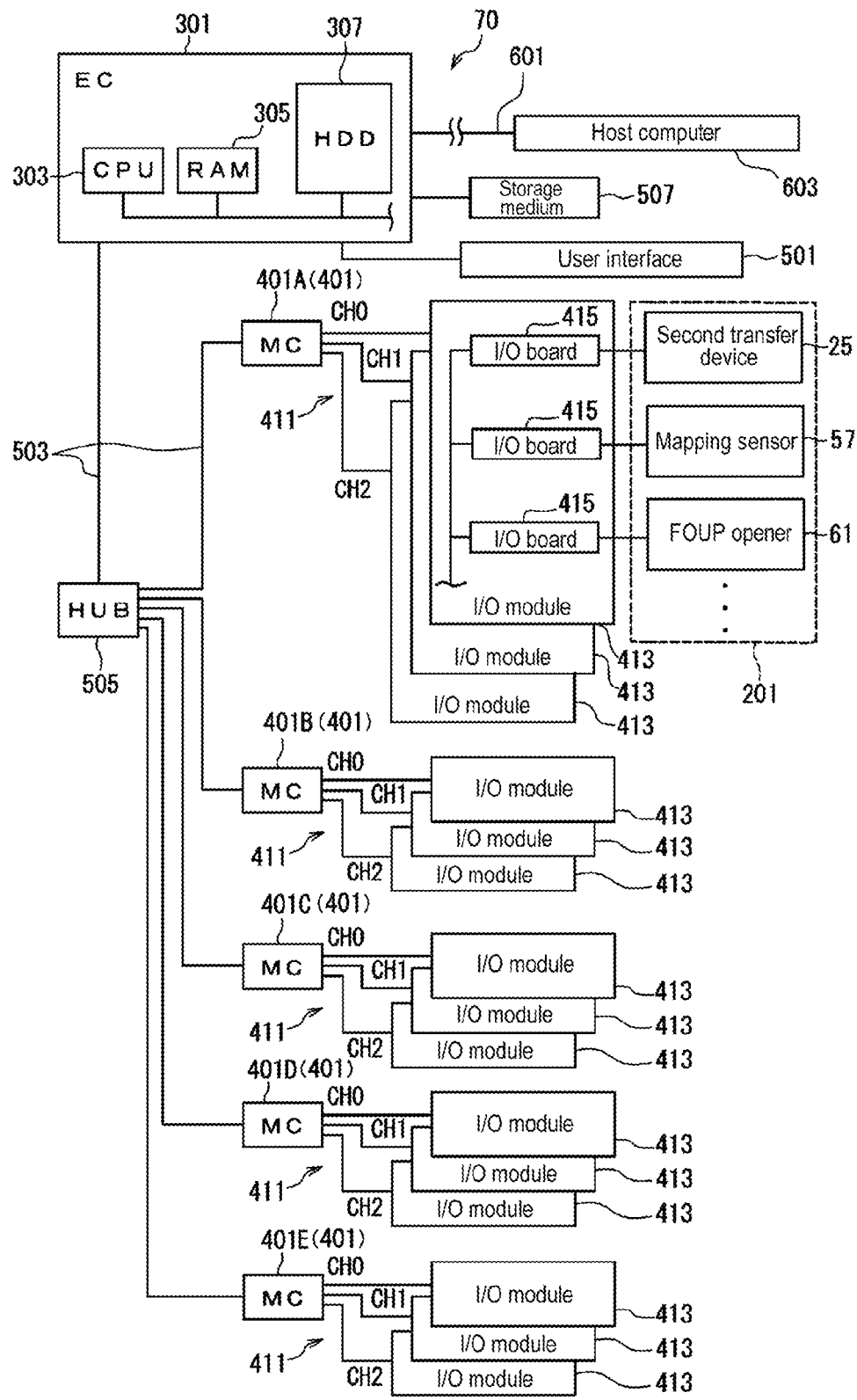
FIG. 3 is a view showing an exemplary configuration of a control unit of the substrate processing system shown in FIG. 1.
Figure 4A:
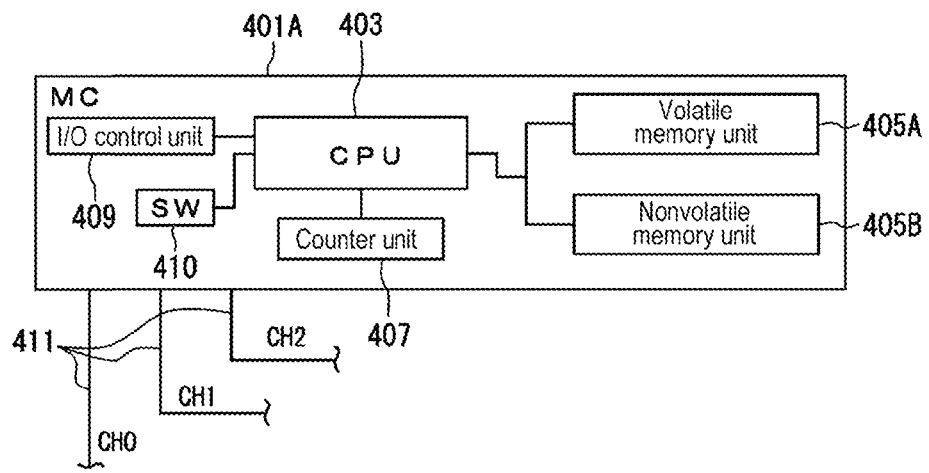
FIG. 4A is a view showing an exemplary configuration of a first control unit of the substrate processing system shown in FIG. 1.

FIGS. 3 and 4A show the schematic configuration of a control system of the substrate processing system 1. The substrate processing system 1 and the respective parts which constitute the process modules 10, the first transfer chamber 11 and the loader module 20, namely the control of end devices 201, are controlled by a control unit 70.

As shown in FIG. 3, the control unit 70 includes, as major elements, MCs (Module Controllers) 401 as first control units which are individual control units installed in a corresponding relationship with the respective modules, an EC (Equipment Controller) 301 as a second control unit which is a general control unit for controlling the substrate processing system 1, and a user interface 501 connected to the EC 301.

The EC 301 and the respective MCs 401 are connected via an in-system LAN (Local Area Network) 503. The in-system LAN 503 includes a switching hub 505. In response to a control signal transmitted from the EC 301, the switching hub 505 switches the MCs 401 as connection destinations of the EC 301.

The EC 301 is a general control unit which governs the respective MCs 401 and controls the operation of the substrate processing system 1. The EC 301 includes a CPU (Central Processing Unit) 303, a RAM 305 as a volatile memory, and an HDD (Hard Disc Drive) 307 as a storage unit.

The storage unit is not limited to the HDD 307. Other storage means such as a nonvolatile memory or the like may be used as the storage unit.

The EC 301 is connected through a LAN 601 to a host computer 603 as a MES (Manufacturing Execution System) for managing the overall manufacturing process of a factory in which the substrate processing system 1 is installed. In cooperation with the control unit 70, the host computer 603 feeds-back the real-time information regarding various processes performed in the factory to a core business system (not shown) and determines which process to perform in view of the load of the factory as a whole and so forth.

The user interface 501 is connected to the EC 301. The user interface 501 includes a keyboard through which a process manager performs a command input operation or other operations to manage the substrate processing system 1, a display which visualizes the operating situation of the substrate processing system 1, a mechanical switch which issues a command to the EC 301, and so forth.

The EC 301 is configured to record information on a computer-readable storage medium (hereinafter simply referred to as a "storage medium") 507 and to read the information from the storage medium 507. For example, a control program and a recipe stored in the storage medium 507 can be used by installing them in the HDD 307 as a storage unit. For example, a CD-ROM, a hard disc, a flexible disc, a flash memory, a DVD, and the like may be used as the storage medium 507. Further, the recipe can be used on an online basis by transmitting the recipe from other devices through, e.g., a dedicated line.

In the EC 301, the CPU 303 reads from the HDD 307 or the storage medium 507 a program (software) including a recipe on a wafer processing method designated by a user via the user interface 501. The program is transmitted from the EC 301 to the respective MCs 401, which allows controlling the processes performed in the process modules 10A to 10D and the loader module 20.

The MCs 401 are installed as individual control units which control the operations of the respective modules. In FIG. 3, there are illustrated five MCs 401 (MC 401A, MC 401B, MC 401C, MC 401D and MC 401E). The MC 401A is configured to control the loader module 20. In FIG. 3, the MC 401A is connected to some of the end devices 201. Examples of the end devices 201 of the loader module 20 include the second transfer device 25 including the mapping sensor 57, and the FOUP opener 61. The MCs 401B, 401C, 401D and 401E control the process modules 10A, 10B, 10C and 10D, respectively. The MCs 401 may be arranged not only in the loader module 20 and the process modules 10 but also in, e.g., the first transfer chamber 11 and the load lock chambers 12A and 12B. The MCs 401 installed in the first transfer chamber 11 and the load lock chambers 12A and 12B may be governed by the EC 301 but are not shown in FIG. 3.

For example, as shown in FIG. 4A, the MC 401A includes a CPU 403, a volatile memory unit 405A such as a RAM or the like, a nonvolatile memory unit 405B, a counter unit 407, an I/O control unit 409 and a switch unit (SW) 410. The nonvolatile memory unit 405B of the MC 401A is formed from a nonvolatile memory such as an SRAM, an MRAM, an EEPROM, a flash memory or the like. The nonvolatile memory unit 405B stores a program (software) including a recipe transmitted from the EC 301, and various kinds of history information and preset values of the loader module 20 controlled by the MC 401A. As described later, the counter unit 407 counts the frequency of the closing/opening operations of the FOUP door 19c (namely, the frequency of the closing/opening operations of the port door 62) in the substrate position correction method of the present embodiment. The I/O control unit 409 of the MC 401A transmits various control signals to I/O modules 413 to be described later and receives signals such as the state information on the respective end devices 201 from the I/O modules 413.

The end devices 201 by the respective MCs 401 are controlled by the I/O (input/output) modules 413. The I/O modules 413 are configured to deliver control signals sent to the respective end devices 201 and input signals transmitted from the end devices 201. The respective MCs 401 are connected to the I/O modules 413 through a network 411. The network 411 connected to the respective MCs 401 includes a plurality of systems such as channels CH0, CH1 and CH2.

Each of the I/O modules 413 includes a plurality of I/O boards 415 (only three of which are shown in FIG. 3) connected to the respective end devices 201 that constitute the process modules 10A, 10B, 10C and 10D. The input/output control of digital signals, analog signals and serial signals in the I/O modules 413 is performed by the I/O boards 415. In FIG. 3, for the sake of convenience in describing the present embodiment, there is representatively shown only the connection between some of the end devices 201 and the I/O boards 415.

The input/output information managed by the I/O boards 415 includes four types of information, namely digital input information DI, digital output information DO, analog input information AI, and analog output information AO. The digital input information DI refers to digital information which is input from the respective end devices 201 ranked low in the control system to the MCs 401 ranked high in the control system. The digital output information DO refers to digital information which is output from the MCs 401 ranked high in the control system to the respective end devices 201 ranked low in the control system. The analog input information AI refers to analog information which is input from the respective end devices 201 to the MCs 401. The analog output information AO refers to analog information which is output from the MCs 401 to the respective end devices 201. The digital input information DI and the analog input information AI include, e.g., information on the status of the respective end devices 201. The digital output information DO and the analog output information AO include, e.g., commands to be transmitted to the respective end devices 201.

Figure 4B:
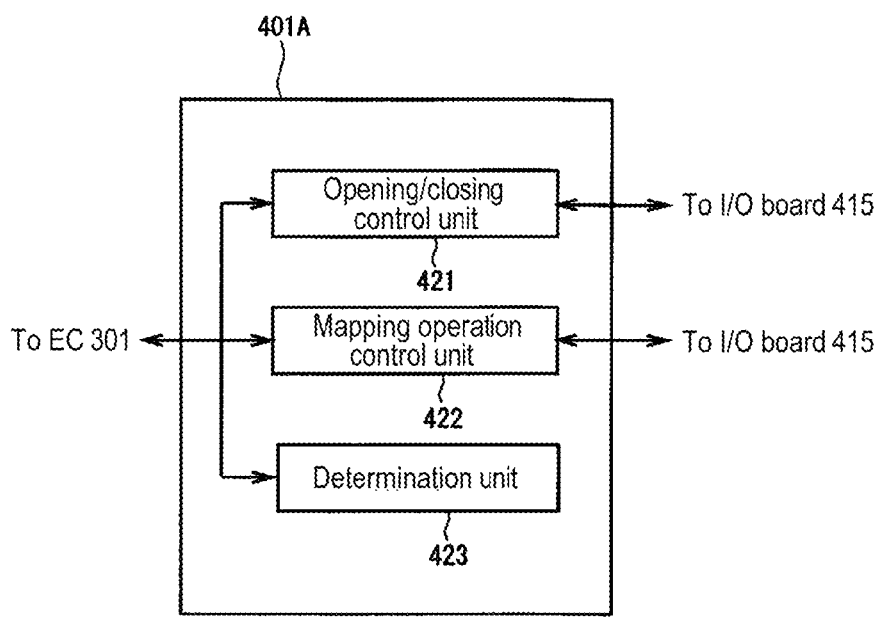
FIG. 4B is a block diagram of the first control unit of the substrate processing system shown in FIG. 1.

Next, the functional configuration of the MC 401A will be described with reference to FIG. 4B. FIG. 4B is a functional block diagram showing the functional configuration of the MC 401A. As shown in FIG. 4B, the MC 401A includes an opening/closing control unit 421, a mapping operation control unit 422 and a determination unit 423, which are realized when the CPU 403 executes the program stored in the nonvolatile memory unit 405B using the volatile memory unit 405A as a work area.

The opening/closing control unit 421 drives the FOUP opener 61 based on recipes or parameters and controls the FOUP opener 61 so as to open or close the FOUP door 19c. Furthermore, if the determination results of the below-mentioned determination unit 423 indicate an "abnormal state", the opening/closing control unit 421 controls the FOUP opener 61 so as to perform a closing/opening operation by which the FOUP door 19c is closed and then opened by the FOUP opener 61.

The mapping operation control unit 422 controls a mapping device based on recipes or parameters so as to perform the mapping operation. If the determination results of the below-mentioned determination unit 423 indicate an "abnormal state" and the closing/opening operation is performed by the opening/closing control unit 421, the mapping operation control unit 422 controls the mapping device so as to perform the mapping operation again.

The determination unit 423 determines whether the position of the wafer W is in a normal state or in an abnormal state, based on the positional information of the wafer W transmitted from the mapping sensor 57.

In the control unit 70 having the configuration described above, the I/O boards 415 connected to the end devices 201 are modularized to form the I/O modules 413. The respective I/O modules 413 are connected to the EC 301 through the MCs 401 and the switching hub 505. The control system is hierarchized by the above-described configuration in which the end devices 201 are not directly connected to the EC 301 but are connected to the EC 301 through the I/O modules 413 and the MCs 401.

Figure 6B:
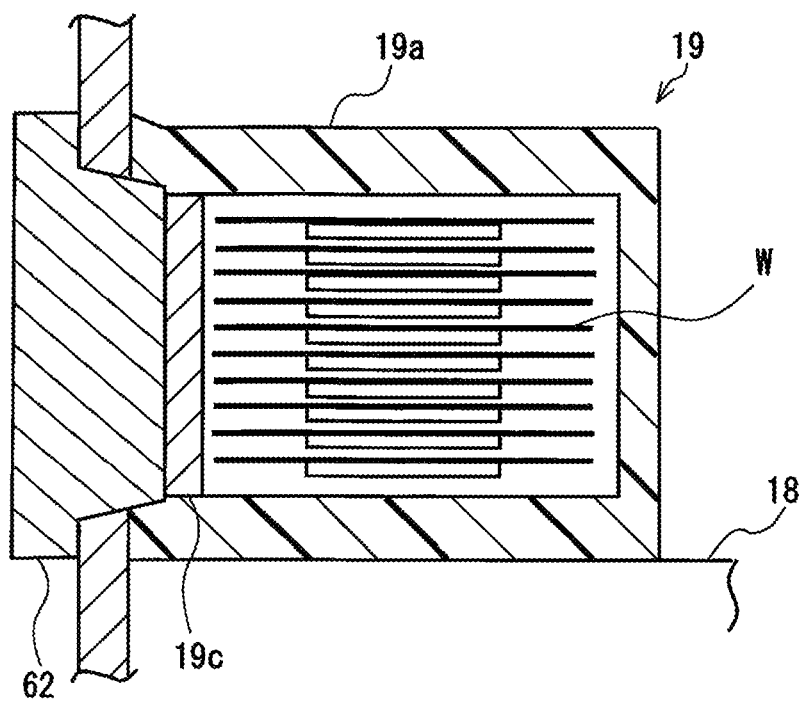
FIG. 6B is an explanatory view showing the closing/opening operation of the FOUP door which is closed.

Next, a method of correcting the position of the substrates accommodated within each of the FOUPs 19 will be described using the substrate processing system 1 having the aforementioned configuration. FIG. 5 is a flowchart schematically illustrating a sequence of a substrate position correction method according to the present embodiment. FIGS. 6A and 6B are explanatory views illustrating the principle under which the positions of the wafers W are corrected by the closing/opening operation of the FOUP door 19c. As shown in FIG. 5, the substrate position correction method according to the present embodiment includes a sequence of STEP1 to STEP5.

First, in STEP1, the mapping operation of the wafers W accommodated within the FOUP 19 is performed by the mapping device. As mentioned above, in the substrate processing system 1, the mapping device is configured by the second transfer device 25 which includes the fork 27b having the mapping sensor 57. The mapping operation is performed, e.g., after finishing the work by which a specified number of wafers W processed in an arbitrary process module 10 of the substrate processing system 1 are accommodated within the FOUP 19 by the second transfer device 25. Accordingly, the FOUP door 19c is kept open when starting the mapping operation of STEP1.

Next, in STEP2, based on the positional information of the wafers W detected through the mapping operation, it is determined whether the position of the wafer W is in an abnormal state. In STEP2, for example, a position of a wafer W is determined to be in the normal state if the detected position of the wafer W falls within a predetermined range of a specified margin (or threshold value) from a position of a wafer W kept in the normal state. On the other hand, the position of the wafer W is determined to be in the abnormal state if the detected position of the wafer W falls outside the predetermined range of the specified margin (or threshold value). In this case, the MC 401A performs STEP2 (determination step) by acquiring the positional information from the mapping sensor 57. The specified margin (or threshold value) used in the determination step may be stored in, e.g., the nonvolatile memory unit 405B of the MC 401A.

If it is determined in STEP2 that the wafer position is abnormal (if "Yes" in STEP2), a closing/opening operation by which the FOUP door 19c is first closed and then opened is performed in STEP5. More specifically, a closing operation is first performed. In the closing operation, the port door 62 of the FOUP opener 61 is first displaced from the lowered position to the raised position and then from the retreated position to the advanced position with the FOUP door 19c held by the port door 62. Then, the FOUP door 19c held by the port door 62 is pressed toward the opening portion 19b of the body 19a of the FOUP 19 and is engaged with the body 19a, thereby closing the opening portion 19b. Subsequently, an opening operation is performed. In the opening operation, the FOUP door 19c is held by the port door 62 and is removed from the body 19a of the FOUP 19. The port door 62 is displaced from the advanced position to the retreated position and then from the raised position to the lowered position and is stored within the second transfer chamber 14. The operation of displacing the port door 62 holding the FOUP door 19c from the lowered position to the raised position and the operation displacing the port door 62 holding the FOUP door 19c from the raised position to the lowered position may not be included in the closing/opening operation. That is to say, in the substrate position correction method of the present embodiment, the closing/opening operation may be performed only between the retreated position and the advanced position of the port door 62.

Figure 6C:
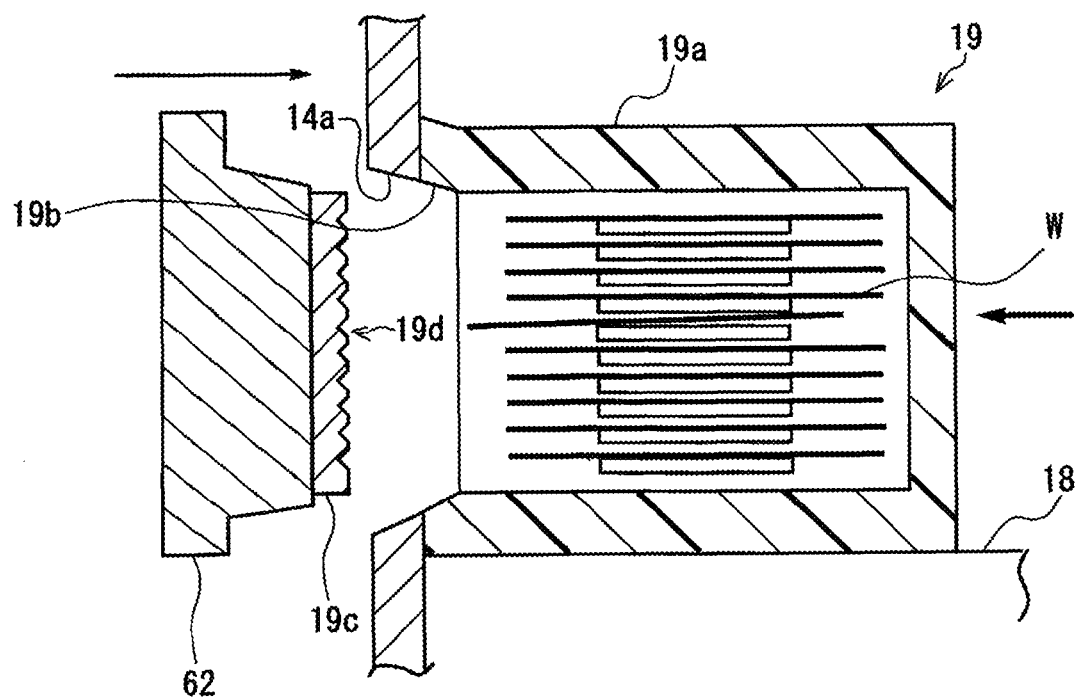
FIG. 6C is an explanatory view showing a closing/opening operation of the FOUP door prior to being closed in a modified example of the first embodiment.

In this regard, FIG. 6A shows the internal state of the FOUP 19 before the FOUP door 19c is closed in a case where the position of the wafer W is abnormal. FIG. 6B shows the internal state of the FOUP 19 once the FOUP door 19c is closed after the state shown in FIG. 6A. In FIG. 6A, for example, ten sheets of wafers W are arranged in a layered shape and are accommodated within the FOUP 19. However, in FIG. 6A, the fifth wafer W from above designated by a thick arrow protrudes toward the opening portion 19b in a tilted state. That is to say, the position of the fifth wafer W is in an abnormal state with the front end thereof lowered. In the state shown in FIG. 6A, the port door 62 holding the FOUP door 19c is displaced from the retreated position to the advanced position, whereby the FOUP door 19c is pressed toward the body 19a of the FOUP 19 to close the opening portion 19b as shown in FIG. 6B. By virtue of the closing operation of the FOUP door 19c, the wall surface of the FOUP door 19c makes contact with the end portion of the abnormal wafer W protruding in a tilted posture, thereby pushing the abnormal wafer W inward. Due to the closing operation, the abnormal state of the position of the fifth wafer W from above is cancelled and the position of the fifth wafer W comes into a normal state. As described above, in the present embodiment, the positional abnormality of the wafer W within the FOUP 19 can be rapidly corrected through the use of the closing/opening operation of the FOUP door 19c without having to use a special correction device. Even in an abnormal state in which the wafer W is tilted upward at the front end thereof, correction can be made in a similar manner. FIG. 6C shows a closing/opening operation of the FOUP door in a modified example of the present embodiment before the FOUP door 19c is closed. As shown in FIG. 6C, for example, peak-valley type grooves 19d may be formed on the inner wall surface of the FOUP door 19c at a pitch substantially equal to the interval of the wafers W accommodated within the FOUP 19. In this case, by making the slant surface or the bottom portion of the valley of each of the grooves 19d contact with the end portion of the wafer W, it is possible to easily correct the position of the wafer W in an abnormal state.

Next, in STEP4, the frequency of the closing/opening operations of the FOUP door 19c (namely, the frequency of the closing/opening operations of the port door 62) is counted. The frequency of the closing/opening operations is counted by, e.g., the counter unit 407 of the MC 401A. The count value is cleared to 0 upon starting the present process sequence and is added up during the repetition of the present process sequence. The first closing/opening operation in the present process sequence is counted as, e.g., "1". Therefore, if the count value is 2 or more, it is meant that a retry of repeating the present process sequence is underway. The retry frequency is equal to the count value subtracted by 1.

Subsequently, in STEP5, it is determined whether the count value of the frequency of the closing/opening operations of the FOUP door 19c is less than a predetermined value. The predetermined value denotes, e.g., a value obtained by adding "1" to the upper limit of the frequency of retry of repeating the present process sequence. That is to say, the value obtained by subtracting 1 from the predetermined value corresponds to the frequency of retry of the present process sequence. For example, if the predetermined value is "5", the upper limit of the retry frequency is "4" and the present process sequence is repeated until the count value of the frequency of the closing/opening operations of the FOUP door 19c reaches "5". The MC 401A determines whether the count value of the frequency of the closing/opening operations of the FOUP door 19c is less than the predetermined value. The predetermined value may be stored in, e.g., the nonvolatile memory unit 405B of the MC 401A.

In STEP5, if the count value of the frequency of the closing/opening operations of the FOUP door 19c is less than the predetermined value (if "Yes" in STEP5), the flow is returned to STEP1 and the processes of STEP1 to STEP5 are repeated. In the repetition of the next and subsequent times, the mapping of STEP1 is "a next mapping" performed based on the present process sequence.

On the other hand, if it is determined in STEP2 that the wafer position is not abnormal (if "No" in STEP2), the wafer position is in a normal state. Therefore, the processes of STEP3 and the subsequent steps are stopped and the preset process sequence is finished. The FOUP 19, in which the wafers W are accommodated in a normal state, may wait for other processes to be performed within the substrate processing system 1 or may be transferred to other substrate processing systems with the FOUP door 19c closed by the FOUP opener 61. If it is determined in STEP2 that the wafer position is not abnormal (if "No" in STEP2), the positional information of the respective wafers W within the FOUP 19 detected by the mapping operation is transmitted from the MC 401A to the EC 301 which is a higher level control unit than the MC 401A. Thus, the positional information of the respective wafers W within the FOUP 19, the information of the number of the wafers accommodated in the FOUP 19 and other information such as the management number of the FOUP 19 or the like are stored in the HDD 307 within the EC 301, the storage medium 507 or the storage unit (not shown) of the host computer 603 which is a higher level control unit than the EC 301. As described above, in the present embodiment, the information on the FOUP 19 is transmitted from the MC 401A to the EC 301 when the last wafer position is determined not to be in an abnormal state (determined to be in a normal state) during the repetition of the sequence of STEP1 to STEP5. For that reason, only the last positional information and the last wafer number information associated with a certain FOUP 19 are transmitted to the EC 301. Accordingly, it is possible to eliminate unnecessary information exchange in the substrate processing system 1 and to alleviate information processing loads.

During the repetition of STEP1 to STEP5, if the count value of the frequency of the closing/opening operations of the FOUP door 19c is determined not to be less than the predetermined value in STEP5 (if "No" in STEP5), namely if the count value is determined to have reached the predetermined value, it is meant that the retry frequency has already reached the upper limit. For example, if the upper limit of the retry frequency is 4 and if the predetermined value is "5", the count value is determined not to be less than the predetermined value ("No" in STEP5) when the count value has reached 5. In this case, it is difficult to correct the wafer position with the closing/opening operation of the FOUP door 19c. Therefore, the subsequent repetition is stopped and the present process sequence is finished. Subsequently, for example, a warning may be issued by an alarm, or an error message may be displayed on the display of the user interface 501. In addition, the positional information of the abnormal wafer W detected in the last mapping operation (STEP1) is transmitted from the MC 401A to the EC 301 which is a higher level control unit than the MC 401A. Thus, the positional information of the respective wafers W within the FOUP 19, the information of the number of the wafers within the FOUP 19 and other information such as the management number of the FOUP 19 or the like are stored in the HDD 307, the storage medium 507 or the storage unit (not shown) of the host computer 603 which is a higher level control unit than the EC 301. As described above, in the present embodiment, the information on the FOUP 19 is transmitted from the MC 401A to the EC 301 when the last wafer position is determined to be in an abnormal state (determined not to be in a normal state). For that reason, only the last positional information and the last wafer number information associated with a certain FOUP 19 are transmitted to the EC 301. Accordingly, it is possible to eliminate unnecessary information exchange in the substrate processing system 1 and to alleviate information processing loads.

As described above, in the substrate processing system 1 and the substrate position correction method of the present embodiment, the abnormal state of the wafer W accommodated within the FOUP 19 can be rapidly corrected through the use of the opening/closing operation of the FOUP door 19c of the FOUP 19 in an automated manner without installing any special mechanism and without resort to a manual work. Accordingly, it is possible to make the down time in the loader module 20 of the substrate processing system 1 as short as possible and to prevent a reduction in the semiconductor device production efficiency.

[Second Embodiment]

Next, a substrate processing system and a substrate position correction method will be described according to a second embodiment of the present disclosure. The configuration of the substrate processing system of the present embodiment is similar to the configuration of the substrate processing system 1 of the first embodiment shown in FIGS. 1 to 4B. Thus, duplicate description will be omitted herein. FIG. 7 is a flowchart illustrating the outline of a sequence of the substrate position correction method of the present embodiment. The substrate position correction method of the present embodiment is a modified example of the substrate position correction method of the first embodiment and includes a sequence of STEP11 to STEP16. The substrate position correction method of the present embodiment can be preferably applied to, e.g., a case where the FOUP 19 accommodating the wafers W as processing targets in multiple stages with the FOUP door 19c kept closed is transferred from other substrate processing system to the substrate processing system 1. Also, the substrate position correction method of the present embodiment can be preferably applied to, e.g., a case where a process performed within the substrate processing system 1 is stopped for a certain reason and where the process is restarted after the wafers W are accommodated within the FOUP 19 and are kept on standby with the FOUP door 19c closed.

First, in STEP11, the FOUP door 19c of the FOUP 19 as a target mounted on one of the load ports 18A, 18B and 18C is opened. That is to say, the FOUP door 19c is held by the port door 62 and is removed from the body 19a of the FOUP 19. The port door 62 is displaced from the advanced position to the retreated position and then from the raised position to the lowered position and is stored within the second transfer chamber 14.

Next, a mapping operation is performed in STEP12. Since the sequence from STEP12 to STEP16 is identical with the respective processes of STEP1 to STEP5 shown in FIG. 5, specific description thereof will be omitted. That is to say, STEP12 corresponds to STEP1 shown in FIG. 5. STEP13 corresponds to STEP2 shown in FIG. 5. STEP14 corresponds to STEP3 shown in FIG. 5. STEP15 corresponds to STEP4 shown in FIG. 5. STEP16 corresponds to STEP5 shown in FIG. 5.

In the present embodiment, the mapping operation of STEP12 is necessarily performed in a case where the FOUP door 19c is opened with the wafers W accommodated within the FOUP 19. If it is determined, based on the results of the mapping of STEP 12, that the wafer position is abnormal in STEP13 (if "Yes" in STEP13), the closing/opening operation of the FOUP door 19c is performed (STEP 14). Then, the frequency of the closing/opening operations is counted (STEP 15) and determination is made as to whether the count value is less than a predetermined value (STEP16). Thereafter, the next mapping operation (STEP12) is performed and the processes from STEP12 to STEP16 are repeated as in the aforementioned embodiment. As described above, in the present embodiment, the mapping operation is first performed when the FOUP door 19c is opened, and if necessary, the sequence of correcting the wafer position is performed. It is therefore possible to reliably acquire the positional information and the number information of the wafers W accommodated within the FOUP 19 as a target. Accordingly, it is possible to reduce the possibility of wafer breakage from occurring or wafer drop when the FOUP door 19c is opened, as compared with a case where the wafer W is immediately taken out from the FOUP 19 by the second transfer device 25. As described above, according to the substrate processing system and the substrate position correction method of the present embodiment, it is possible for the loader module 20 to reliably and safely perform the operation of loading and unloading the wafers W with respect to the FOUP 19 as a target.

Other configurations and effects of the present embodiment are the same as those of the first embodiment. Therefore, description thereon will be omitted.

While certain embodiments of the present disclosure have been described in detail by way of example, the present disclosure is not limited to the aforementioned embodiments. For example, the substrate to be processed in the substrate processing system 1 is not limited to the semiconductor wafer but may be, e.g., a glass substrate for the manufacture of a flat panel display or a substrate for the manufacture of a solar cell panel.

In the aforementioned embodiments, the substrate processing system including four process modules 10 and one loader module 20 has been described by way of example. However, the configuration of the substrate processing system is provided for illustrative purposes only and the present disclosure may be applied to a substrate processing system having other configurations.

In the aforementioned embodiments, the substrate processing system including a plurality of vacuum devices has been taken as an example. However, the present disclosure may be applied to a substrate processing system that performs processes under an atmospheric pressure.

In the aforementioned embodiments, if the wafer position is determined not to be abnormal (if "No") in STEP2 (or STEP 13) or if the count value of the frequency of the closing/opening operations of the FOUP door 19c is determined not to be less than the predetermined value (if "No") in STEP5 (or STEP16), the positional information on the wafers W is transmitted from the MC 401A to the EC 301 which is a higher level control unit than the MC 401A. That is to say, during the repetition of the sequence of STEP1 to STEP5 (or STEP 12 to STEP 16), the notification to the EC 301 is performed only when the last wafer position is determined to be in a normal state or in an abnormal state. However, in an alternative embodiment, the information on the FOUP 19 including the positional information on the wafers W may be transmitted from the MC 401A to the EC 301 each time when the mapping operation is performed.

In the aforementioned embodiments, the determination of STEP2 (or STEP13) and the determination of STEP5 (or STEP 16) are performed by the MC 401A. However, these determinations may be performed by the EC 301 which is a higher level control unit.

The subject international application claims the priority of Japanese Patent Application No. 2012-002038 filed on Jan. 10, 2012, the entire contents of which are incorporated herein by reference.

What is claimed is:

1. A substrate processing system that loads and unloads substrates through the use of a transport container accommodating and supporting the substrates in multiple stages, the transport container including an opening portion for inserting the substrates and an opening/closing door for opening or closing the opening portion, the system comprising:
   a mounting unit on which the transport container is mounted;
   an opening/closing device configured to hold the opening/closing door of the transport container mounted on the mounting unit to open or close the opening/closing door;
   a mapping device configured to perform a mapping operation while the opening/closing door is kept open, the mapping operation including detecting and acquiring a position of each of the substrates accommodated within the transport container as substrate position information; and
   a first control unit configured to control the opening/closing device and the mapping device,
   wherein the first control unit determines, based on the substrate position information detected by the mapping device, whether the substrate position is in a normal state or in an abnormal state,
   wherein if the substrate position is in the abnormal state, the first control unit controls the opening/closing device to perform a closing/opening operation by which the opening/closing door is closed and then opened to correct the substrate position in the abnormal state, and thereafter, controls the mapping device to perform a next mapping operation,
   wherein the first control unit controls the opening/closing device and the mapping device to repeat the closing/opening operation and the next mapping operation, and
   wherein if the substrate position detected by the next mapping operation is in the normal state, the first control unit controls the opening/closing device and the mapping device to stop the closing/opening operation and the next mapping operation.

2. The system of claim 1, wherein the first control unit transmits the substrate position information of the normal state obtained in the last mapping operation to a second control unit which is a higher level control unit than the first control unit.

3. The system of claim 1, wherein, if the frequency of repetition of the closing/opening operation and the next mapping operation reaches a predetermined frequency, the first control unit controls the opening/closing device and the mapping device to stop the repetition of the closing/opening operation and the next mapping operation, and transmits the substrate position information obtained in the last mapping operation to a second control unit which is a higher level control unit than the first control unit.

4. A substrate position correction method for correcting a position of each of substrates in a substrate processing system that loads and unloads the substrates through the use of a transport container accommodating and supporting the substrates in multiple stages, the transport container including an opening portion for inserting the substrates therethrough and an opening/closing door for opening or closing the opening portion, the system comprising:
   a mounting unit on which the transport container is mounted;
   an opening/closing device configured to hold the opening/closing door of the transport container mounted on the mounting unit to open or close the opening/closing door;
   a mapping device configured to perform a mapping operation while the opening/closing door is kept open, the mapping operation including detecting and acquiring a position of each of the substrates accommodated within the transport container as substrate position information; and
   a control unit configured to control the opening/closing device and the mapping device, wherein the method comprises:
   performing the mapping operation using the mapping device;
   if it is detected in the mapping operation that the substrate position is in an abnormal state, performing a closing/opening operation by which the opening/closing door is closed and then opened to correct the substrate position in the abnormal state; and
   performing a next mapping operation using the mapping device,
   wherein performing a closing/opening operation and performing a next mapping operation are repeated, and
   wherein, if the substrate position detected by the next mapping operation is in a normal state, the repetition of performing a closing/opening operation and performing a next mapping operation is stopped.

5. The method of claim 4, wherein if the frequency of the repetition of performing a closing/opening operation and performing a next mapping operation reaches a predetermined frequency, the repetition is stopped.

6. A substrate processing system that loads and unloads substrates through the use of a transport container accommodating and supporting the substrates in multiple stages, the transport container including an opening portion for inserting the substrates therethrough and an opening/closing door for opening or closing the opening portion, the system comprising:
   a mounting unit on which the transport container is mounted;
   an opening/closing device configured to hold the opening/closing door of the transport container mounted on the mounting unit to open or close the opening/closing door;
   a mapping device configured to perform a mapping operation while the opening/closing door is kept open, the mapping operation including detecting and acquiring a position of each of the substrates accommodated within the transport container as substrate position information; and
   a control unit configured to control the opening/closing device and the mapping device,
   wherein the control unit includes:
      a determination unit configured to determine, based on the substrate position information detected by the mapping device, whether the substrate position is in a normal state or in an abnormal state;
      an opening/closing control unit configured to, if the determination result of the determination unit indicates the abnormal state, allow the opening/closing device to perform a closing/opening operation by which the opening/closing door is closed and then opened to correct the substrate position in the abnormal state; and
      a mapping operation control unit configured to allow the mapping device to perform a next mapping operation after the closing/opening operation is performed,
   wherein the control unit controls the opening/closing device and the mapping device to repeat the closing/opening operation and the next mapping operation, and
   wherein if the substrate position detected by the next mapping operation is in the normal state, the control unit controls the opening/closing device and the mapping device to stop the closing/opening operation and the next mapping operation.

* * * * *